(12) United States Patent
Yeh et al.

(10) Patent No.: US 7,729,127 B2
(45) Date of Patent: Jun. 1, 2010

(54) MOUNTING MECHANISM FOR ELECTRONIC DEVICE

(75) Inventors: Chin-Wen Yeh, Taipei Hsien (TW); Zhen-Neng Lin, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 205 days.

(21) Appl. No.: 11/967,083

(22) Filed: Dec. 29, 2007

(65) Prior Publication Data

US 2009/0109644 A1 Apr. 30, 2009

(30) Foreign Application Priority Data

Oct. 31, 2007 (CN) .................. 2007 2 0201250 U

(51) Int. Cl.
*H05K 7/02* (2006.01)
*H05K 7/04* (2006.01)
(52) U.S. Cl. .................. 361/810; 361/807; 361/803
(58) Field of Classification Search .......... 361/730, 361/742, 748, 752, 790, 797, 800, 803, 807, 361/810; 312/223; 174/138
See application file for complete search history.

(56) References Cited

U.S. PATENT DOCUMENTS

| | | | | |
|---|---|---|---|---|
| 6,017,226 A * | 1/2000 | Jeffries et al. | .................. | 439/92 |
| 6,104,614 A * | 8/2000 | Chou et al. | .................. | 361/704 |
| 6,327,160 B1 * | 12/2001 | Liao | ............................ | 361/809 |
| 6,409,446 B1 * | 6/2002 | Schwarz | ...................... | 411/552 |
| 6,816,211 B2 * | 11/2004 | Kim et al. | ...................... | 349/58 |
| 7,300,299 B2 * | 11/2007 | Wang | ........................... | 439/326 |
| 7,381,102 B2 * | 6/2008 | Camacho | ..................... | 439/801 |
| 7,387,518 B2 * | 6/2008 | Kozlovski | ..................... | 439/92 |

* cited by examiner

*Primary Examiner*—Hung S Bui
(74) *Attorney, Agent, or Firm*—Frank R. Niranjan

(57) ABSTRACT

A mounting mechanism for mounting an electronic device to a chassis, the electronic device defining a first securing hole, and the chassis defining a second securing hole, includes a securing member having a base. A plurality of elastic hooks extends from a bottom of the base. At least one blocking portion protrudes laterally from the base. The elastic hooks extend through the first securing hole and the second securing hole and are engaged with a bottom side of one of the chassis and the electronic device. The at least one blocking portion abuts on the other one of the chassis and the electronic device, for sandwiching the electronic device and the chassis between the hooks and the at least one blocking portion.

13 Claims, 12 Drawing Sheets

MOUNTING MECHANISM FOR ELECTRONIC DEVICE

BACKGROUND

1. Field of the Invention

The present invention relates to mounting mechanisms, particularly to a mounting mechanism for securely and firmly mounting an electronic device to a chassis or a base.

2. Description of Related Art

Electronic devices such as motherboards or fan modules are typically secured in a computer enclosure for playing important roles while the computer is running. Conventionally, a motherboard or a fan is mounted in a chassis of the computer enclosure by a plurality of screws passing through corresponding holes defined in the electronic device and the chassis, making it difficult and time consuming to replace or remove the device for repair. Moreover, when the computer is running or during shipment, these electronic devices can generate an undesirable amount of vibration and attendant vibration noise, if care is not taken to properly isolate them from the computer interior supporting structure upon which the electronic devices mounted. More seriously, the components on the electronic device may be damaged by the vibrations.

Accordingly, what is needed is a mounting mechanism for an electronic device capable of absorbing vibration generated between the electronic device and the supporting structure.

SUMMARY

A mounting mechanism for mounting an electronic device to a chassis, the electronic device defining a first securing hole, and the chassis defining a second securing hole, includes a securing member having a base. A plurality of elastic hooks extends from a bottom of the base. At least one blocking portion protrudes laterally from the base. The elastic hooks extend through the first securing hole and the second securing hole and are engaged with a bottom side of one of the chassis and the electronic device. The at least one blocking portion abuts on the other one of the chassis and the electronic device, for sandwiching the electronic device and the chassis between the hooks and the at least one blocking portion.

Other advantages and novel features of the present invention will become more apparent from the following detailed description of preferred embodiment when taken in conjunction with the accompanying drawings, in which:

DETAILED DESCRIPTION OF THE EMBODIMENT

Figure 1:
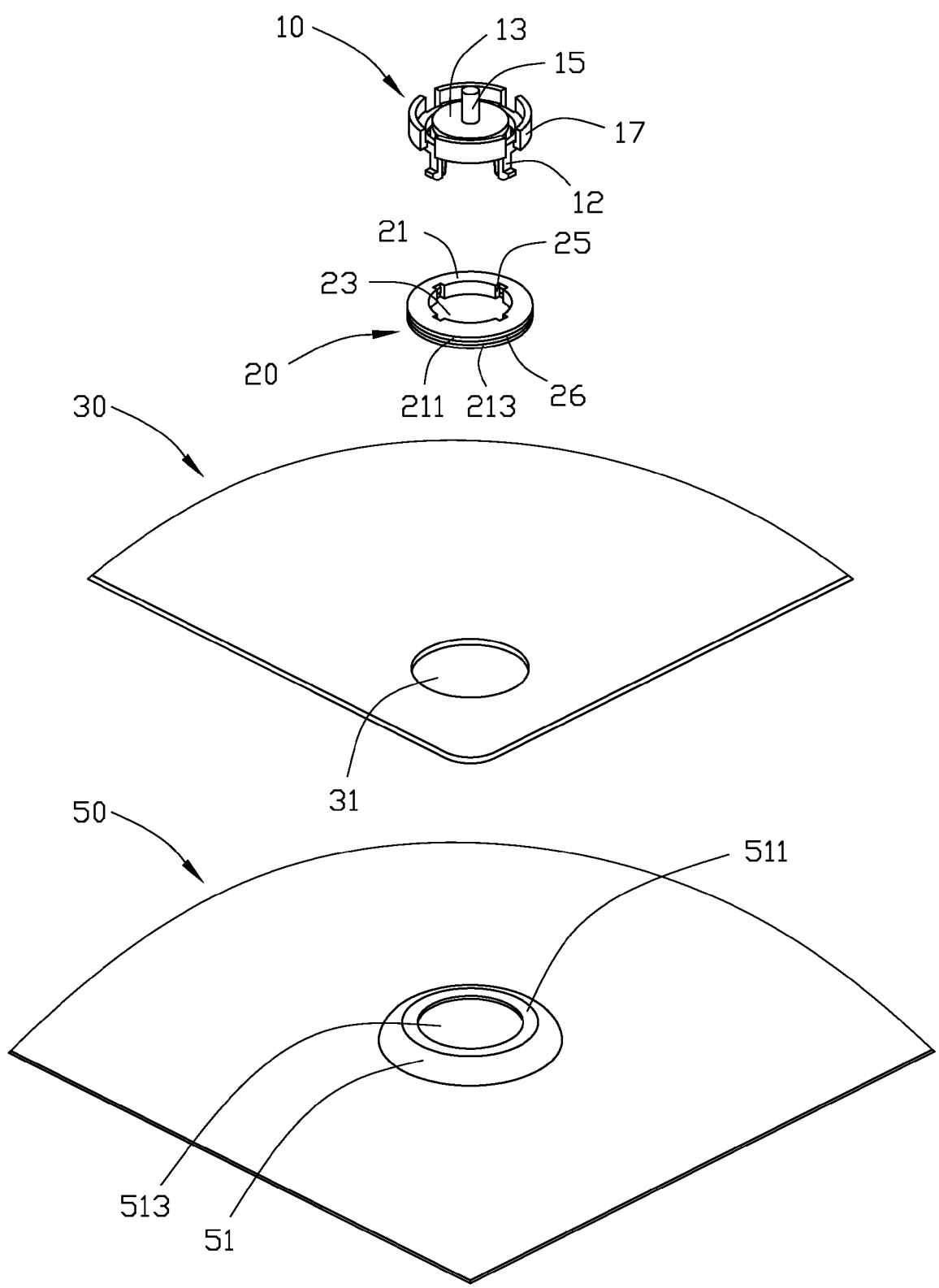
FIG. 1 is an isometric, perspective assembled view of a mounting mechanism for an electronic device in accordance with a preferred embodiment of the present invention, together with part of the electronic device.

FIG. 1 illustrates a first preferred embodiment of the mounting mechanism for mounting an electronic device to an enclosure or a chassis 50. The mounting mechanism includes a resilient securing member 10 and a damping member 20 disposed between the electronic device 30 and the chassis 50 for absorbing vibration.

Figure 2:
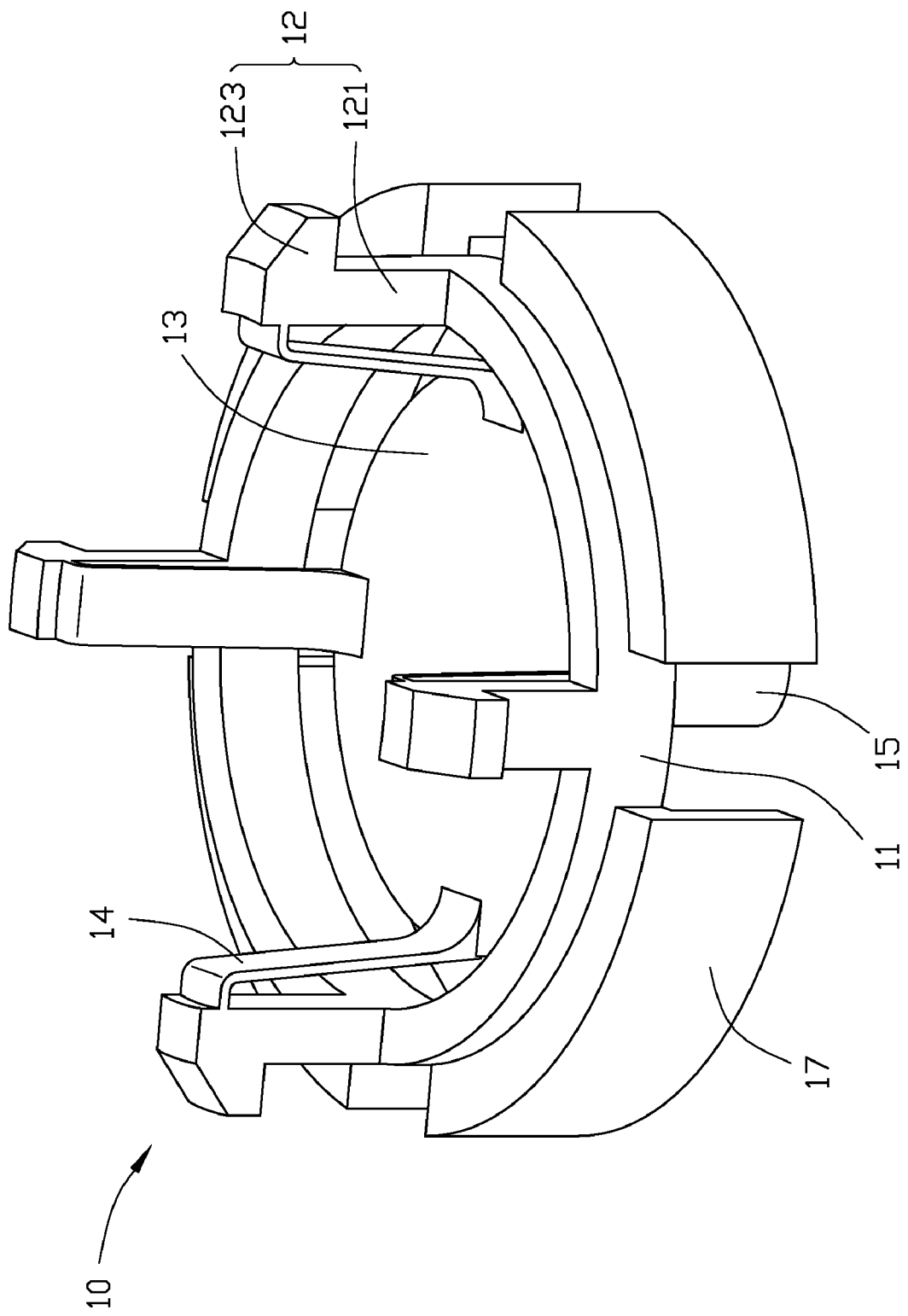
FIG. 2 is an isometric, enlarged view of a securing member of the mounting mechanism of FIG. 1, but viewed from another aspect.
Figure 3:
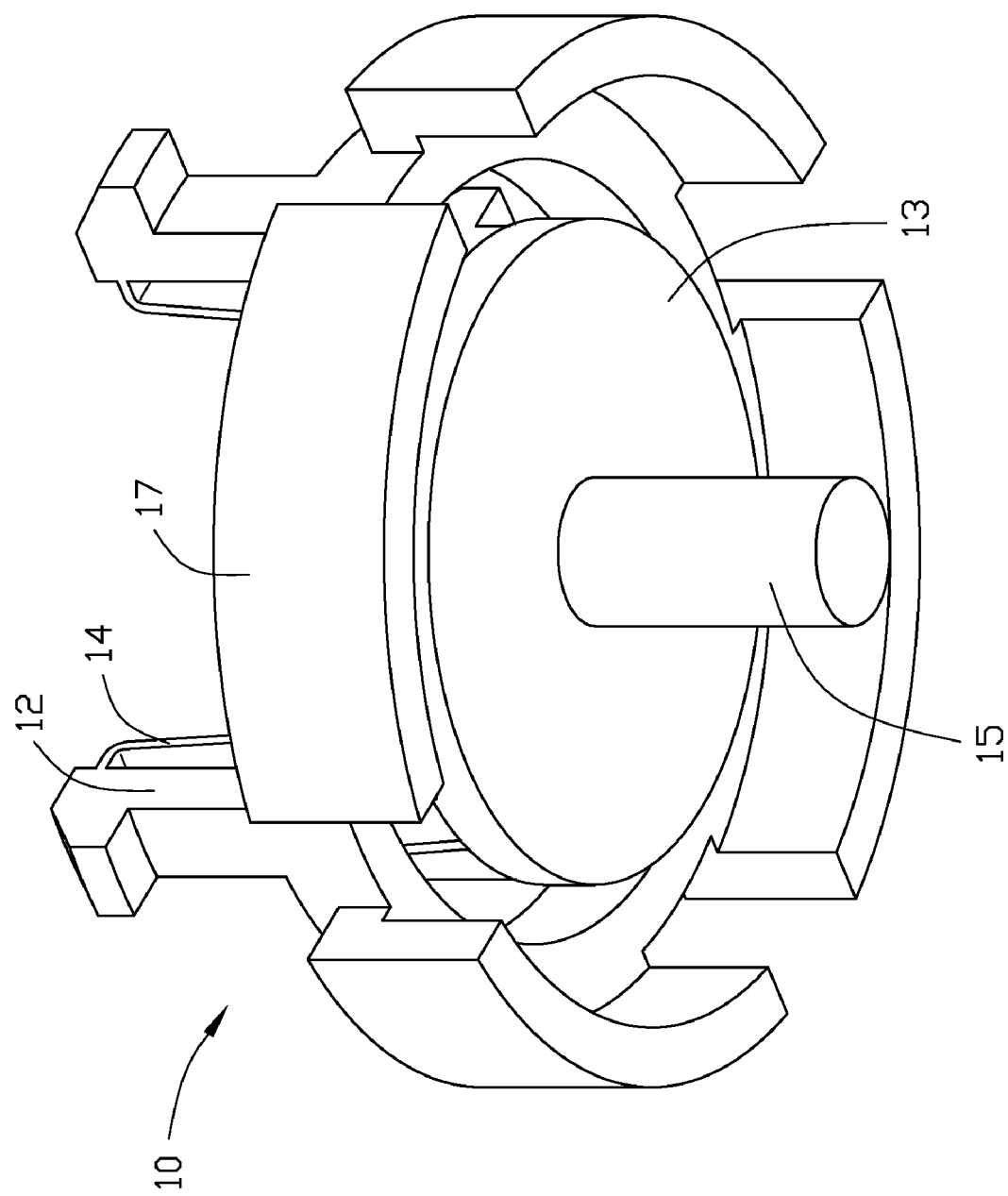
FIG. 3 is an isometric, enlarged view of a securing member of the mounting mechanism of FIG. 1, but viewed from a third aspect.
Figure 10:
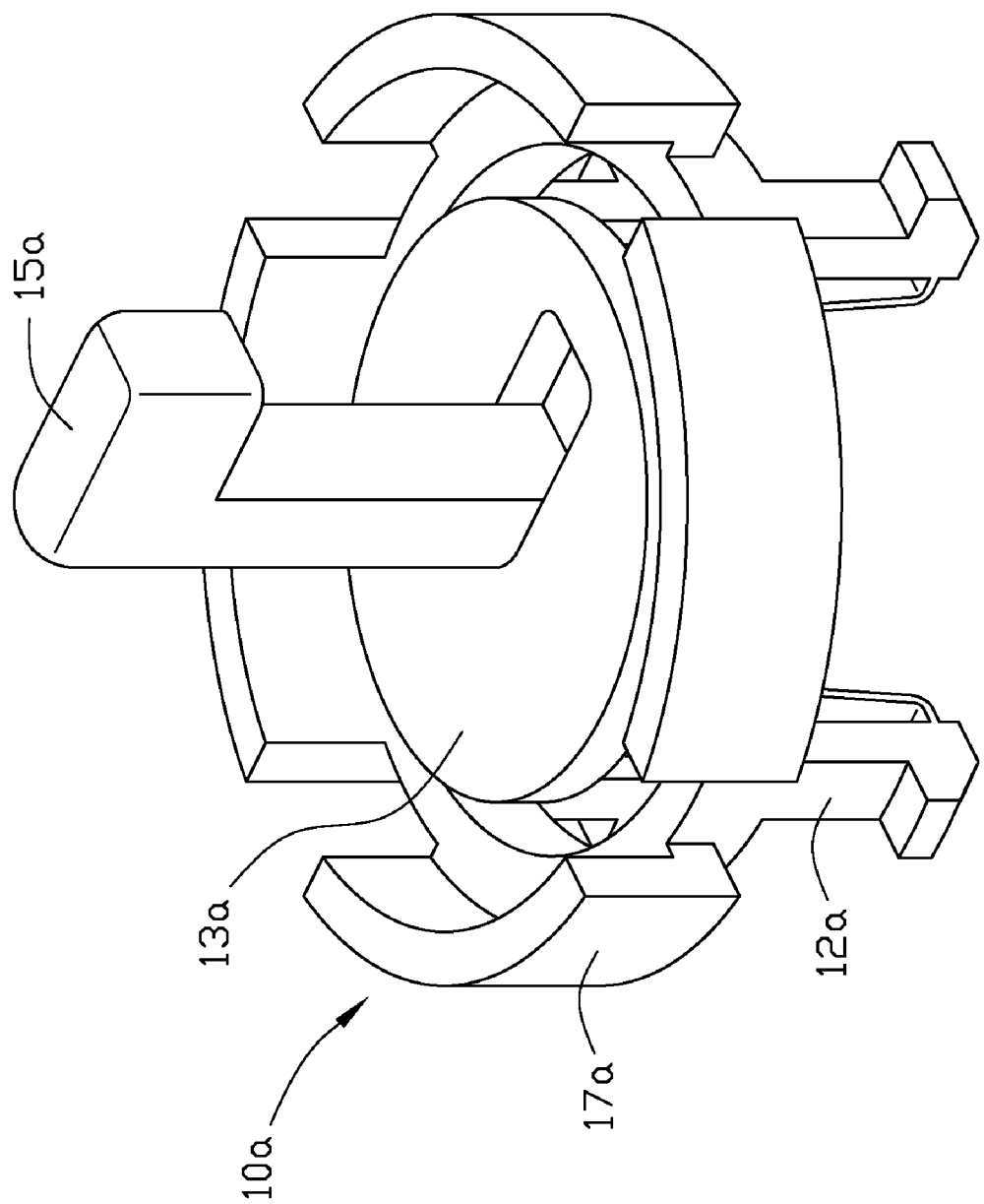
FIGS. 10-12 are alternative embodiments of the securing member of the mounting mechanism.
Figure 11:
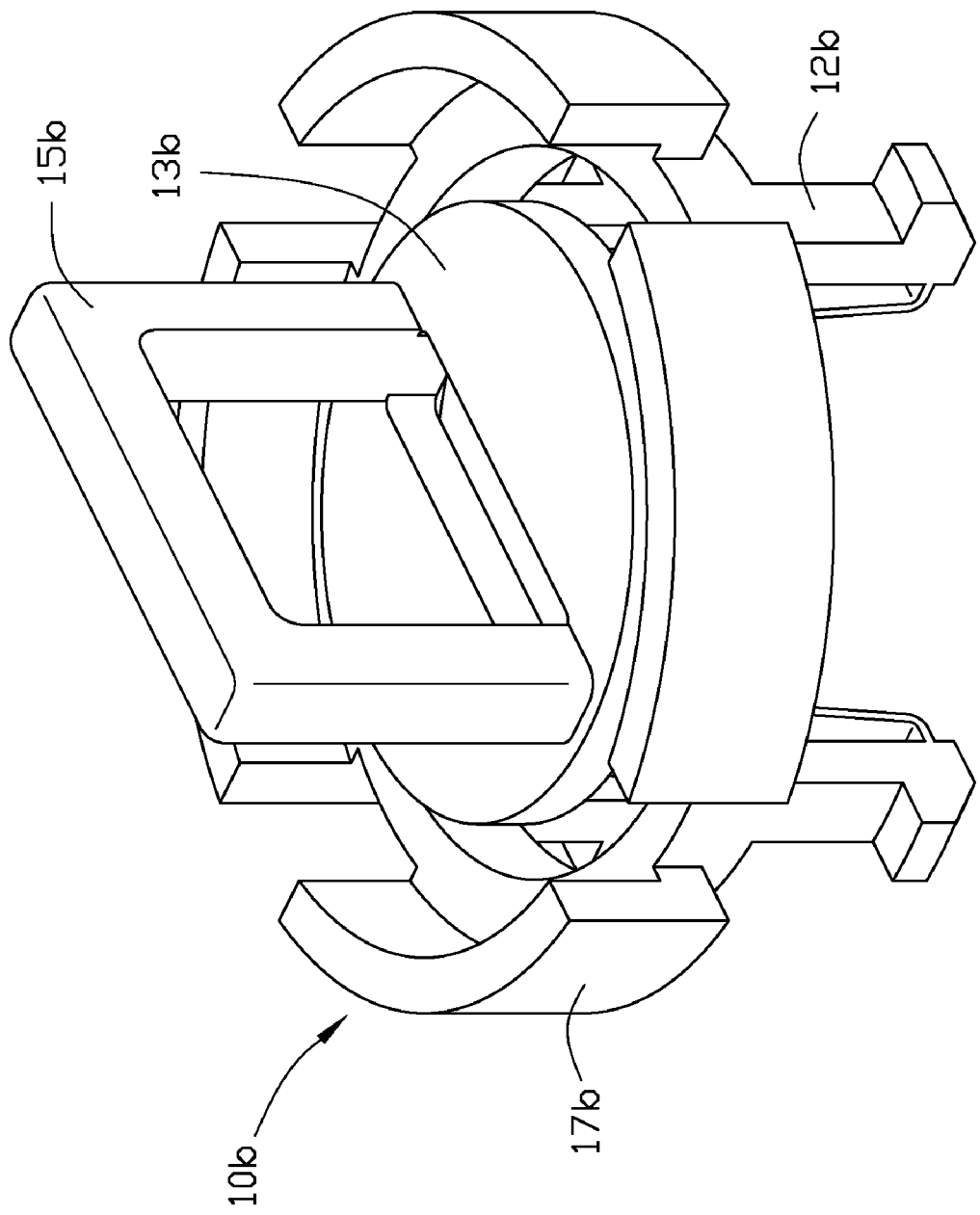
Figure 12:
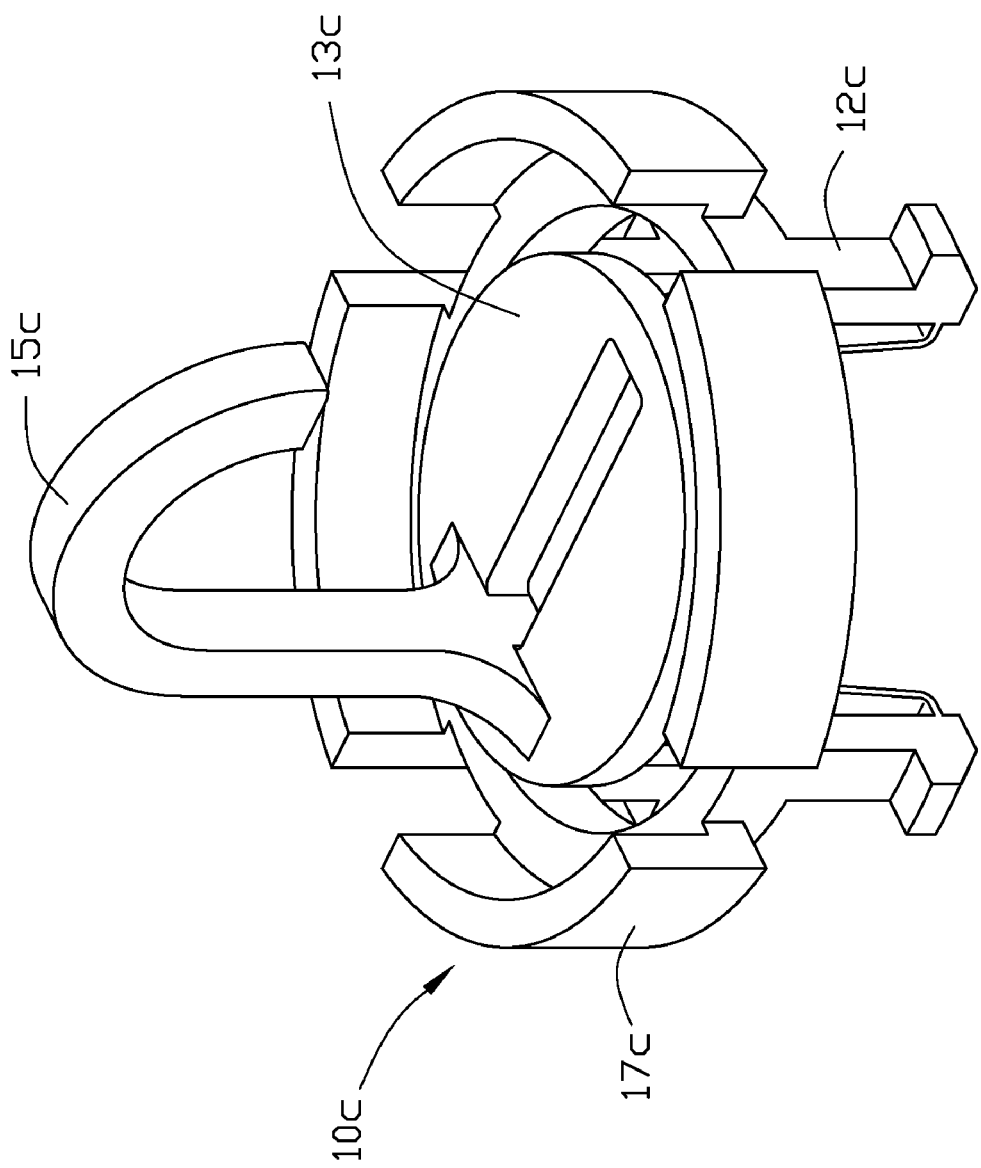

Referring also to FIGS. 2-3, the securing member 10 includes an annular base 11. Four elastic hooks 12 symmetrically extend from a bottom edge of the annular base 11. Each hook 12 includes a cantilever 121 flush with the outer surface of the annular base 11 and a claw 123 protruding outward from an end of the cantilever 121. Four spaced blocking portions 17 protrude laterally from the outer surface of the base 11. A round actuating member 13 is formed in a center of the annular base 11. A resilient connecting arm 14 obliquely depending from a distal end of each claw 123 of the hook 12 extends to a side edge of the actuating member 13, for connecting the actuating member 13 to the annular base 11. A cylindrical operating handle 15 protrudes from an upper center of the round actuating member 15. As shown in FIGS. 10-12, the operating handle 15 can be other shapes convenient for operating.

Figure 5:
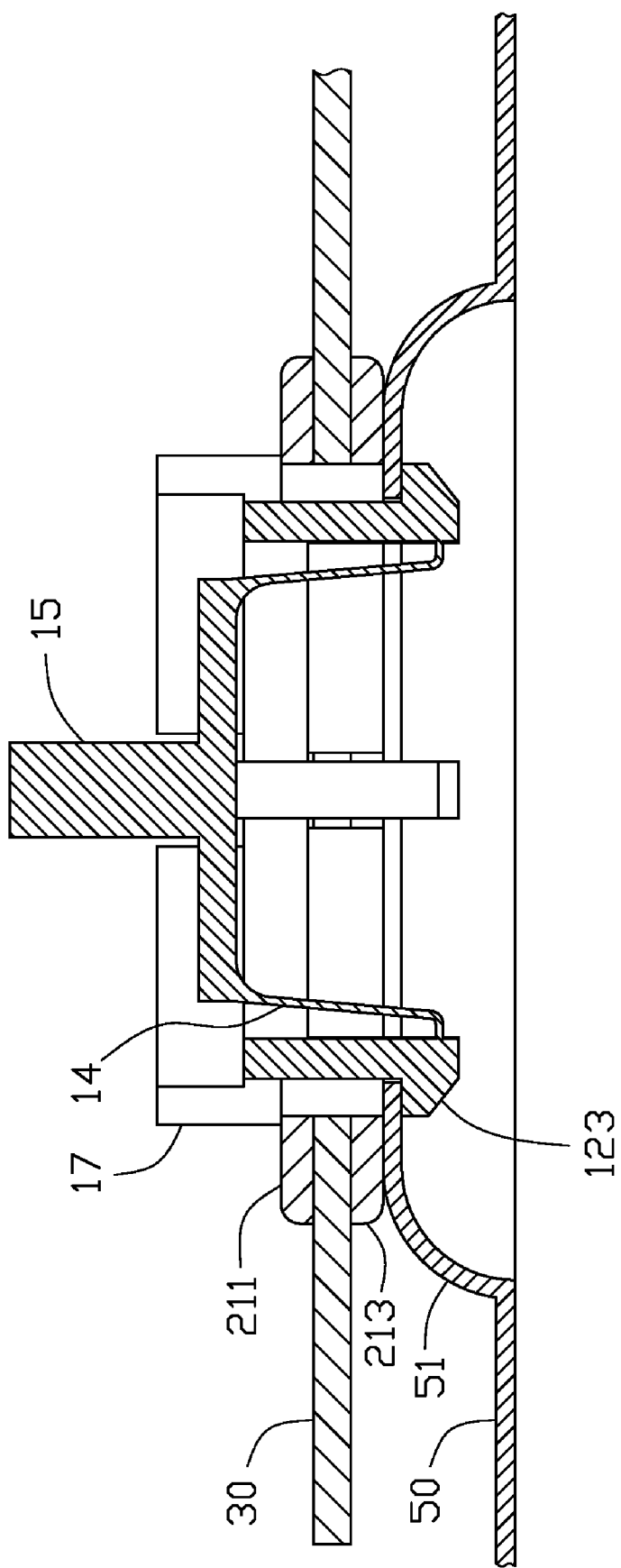
FIG. 5 is a cutaway view along direction V-V of the mounting mechanism and the electronic device of FIG. 4.
Figure 6:
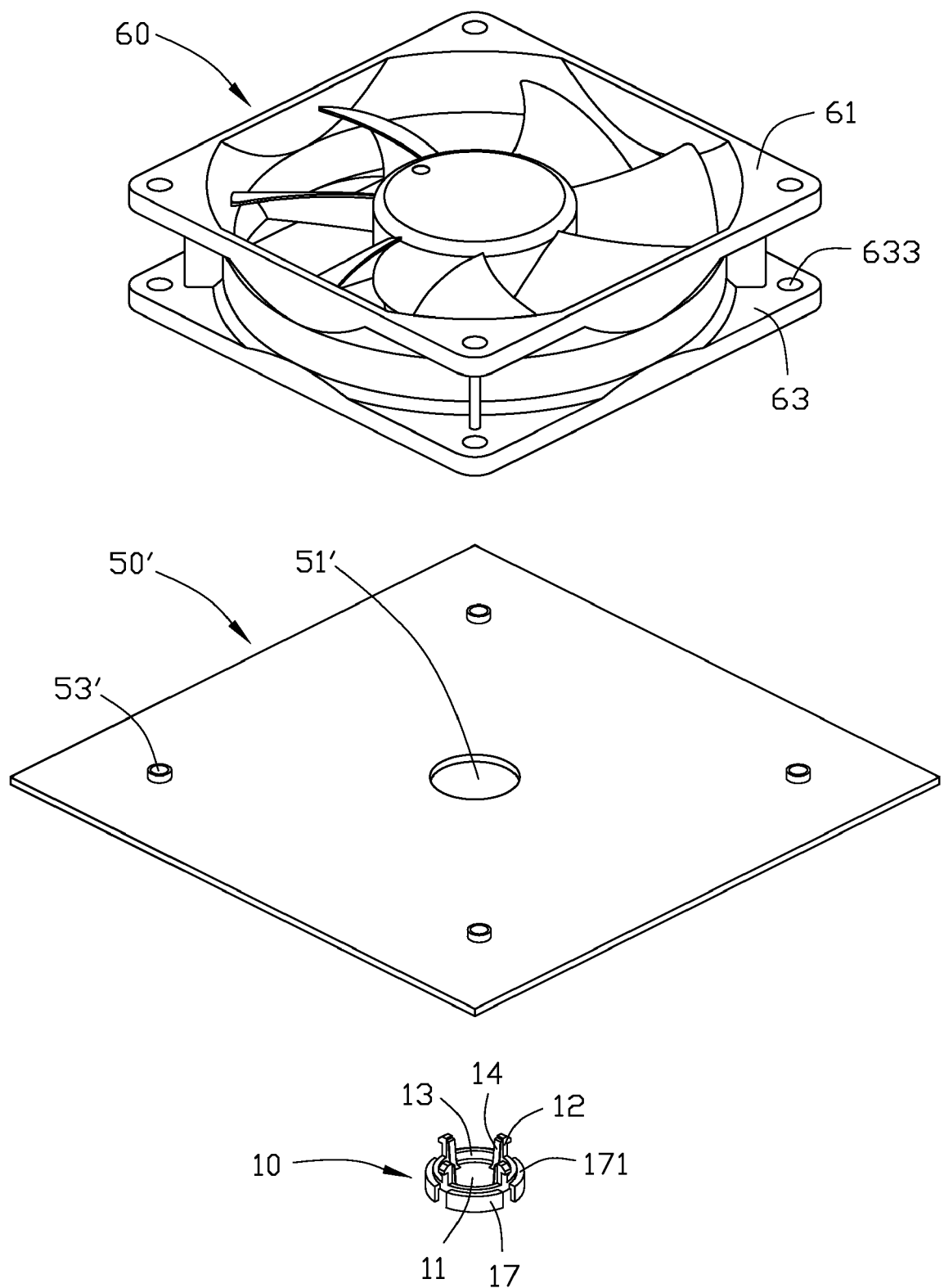
FIG. 6 is an isometric, perspective assembled view of a mounting mechanism for an electronic device in accordance with a second embodiment of the present invention, together with another type of electronic device.
Figure 7:
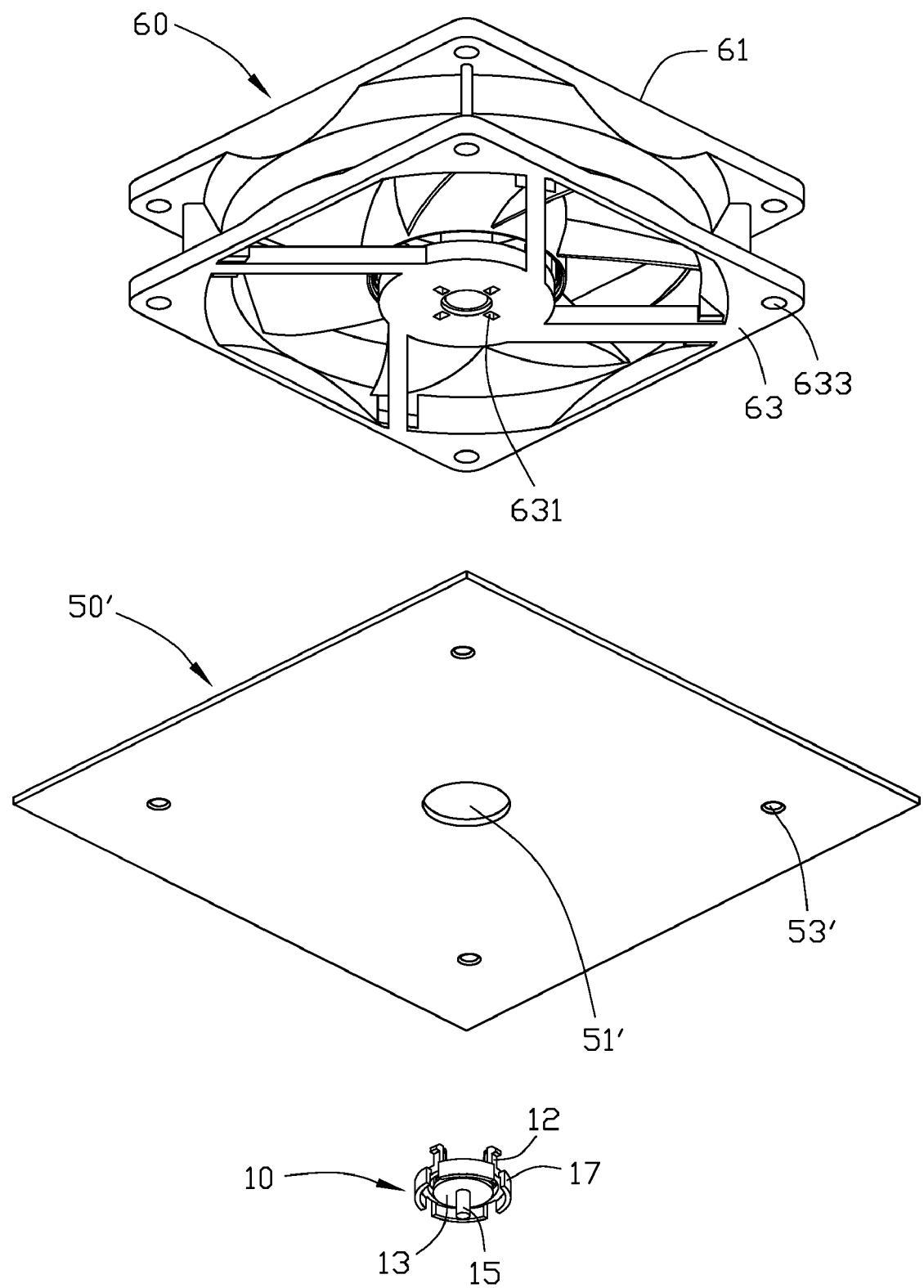
FIG. 7 is an isometric, perspective assembled view of the mounting mechanism for an electronic device of FIG. 6, but view from another aspect.
Figure 8:
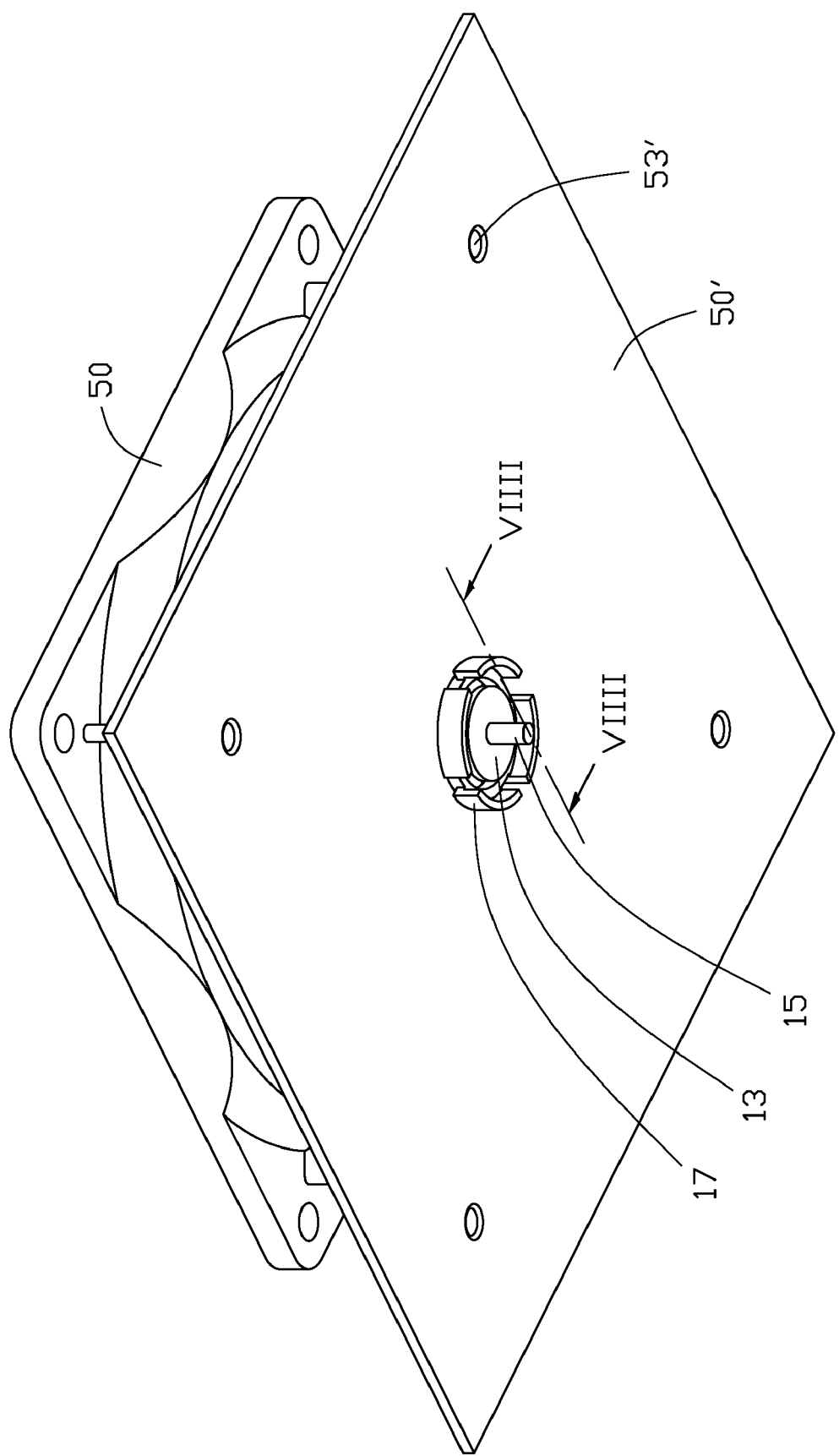
FIG. 8 is an isometric, assembled view of the mounting mechanism and the electronic device of FIG. 7.
Figure 9:
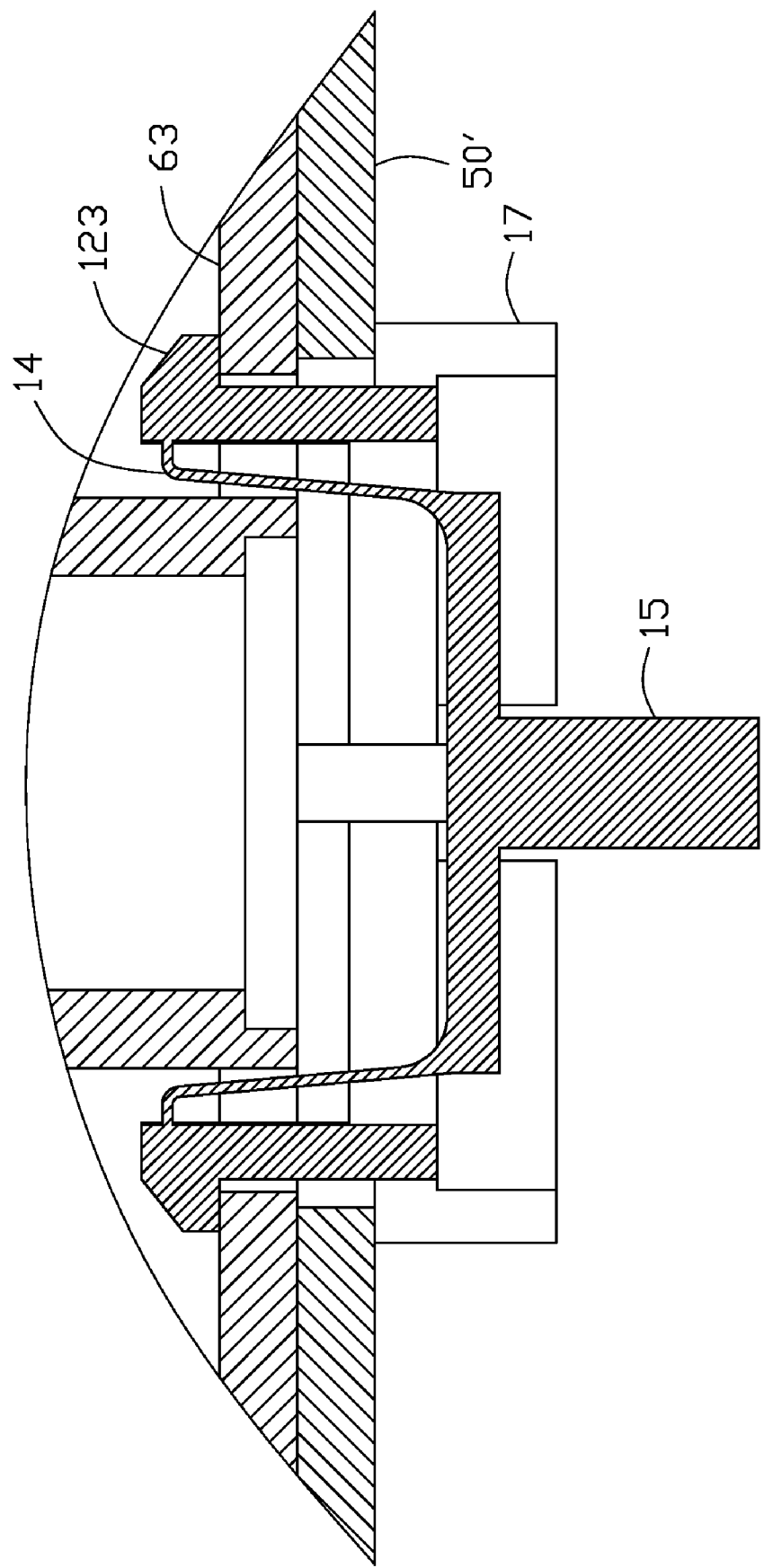
FIG. 9 is a cutaway view along direction VIIII-VIIII of the mounting mechanism and the electronic device of FIG. 8.

The damping member 20 is made of material having good resiliency such as plastic or elastomer. The damping member 20 includes a ring shaped body 21 having a through hole 23. Four slots 25 corresponding to the claws 123 are defined in the inner surface of the body 21 and are in communication with the through hole 23. The through hole 23 of the body 21 is a little greater in diameter than the annular base 11 of the securing member 10, and the slots 25 of the damping member 20 are a little greater in width than the claws 123 of the hooks 12, for allowing the base 11 to freely extend through the damping member 20. A receiving slot 26 is defined in the outer surface of the body 21 along the circumference thereof, thereby dividing the body 21 into an upper flange 211 and a lower flange 213 (shown in FIG. 5).

Figure 4:
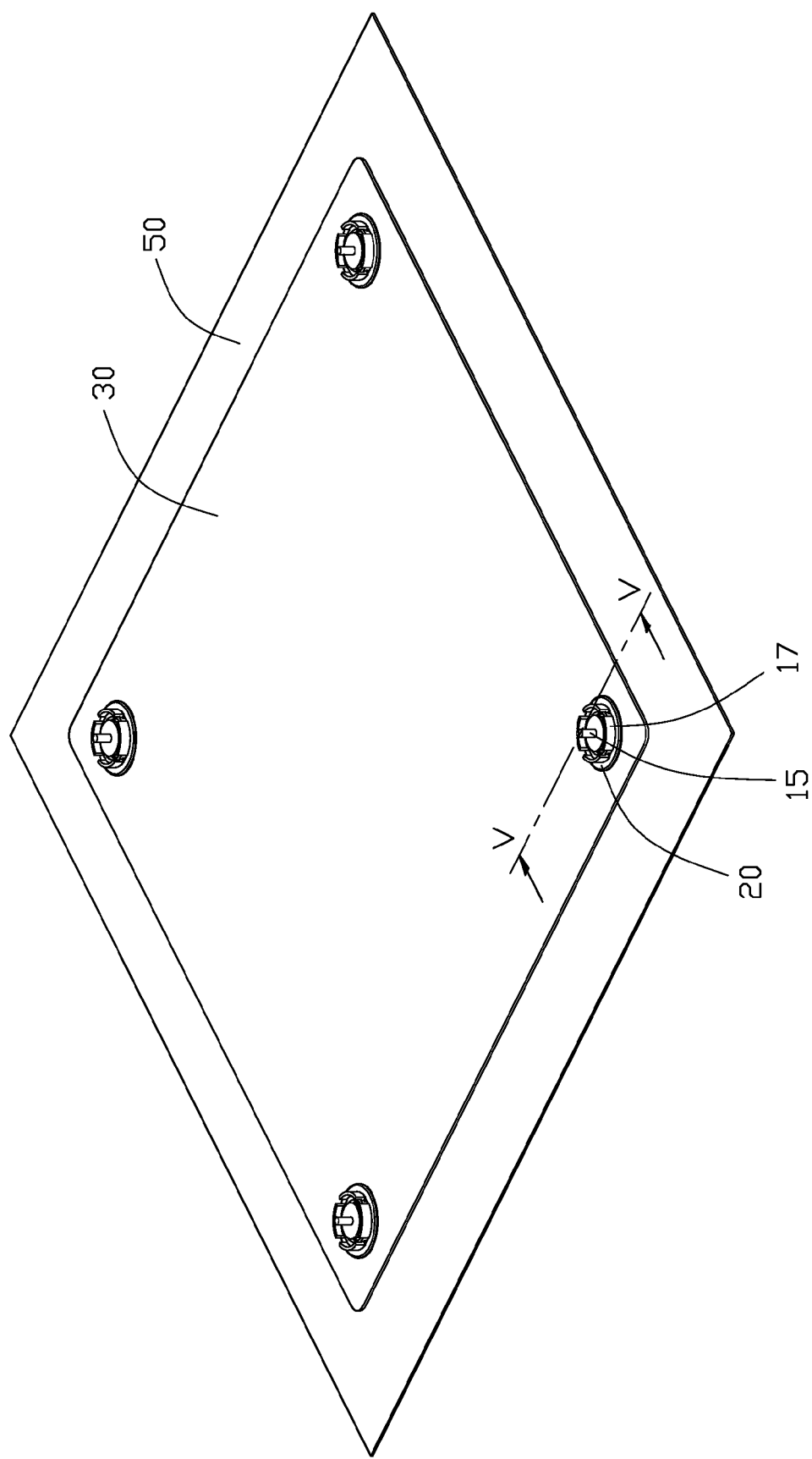
FIG. 4 is an isometric, entirely assembled view of the mounting mechanism and the electronic device.

Referring also to FIG. 4, in the first preferred embodiment of present invention, the electronic device is a motherboard 30. Four through holes 31 are defined in the motherboard 30 at four corners thereof. Each through hole 31 corresponds to a securing member 10 and a damping member 20. The diameter of the through hole 31 is greater than the distance between outmost ends of two opposite claws 123 of the hooks 12. The chassis 50 also includes four cone-shaped securing portions 51 corresponding to the through holes 31 in the motherboard 30, the securing members 10 and the damping members 20. A flat supporting surface 511 is formed on the top of the securing portions 51 with a securing hole 513 defined therein corresponding to the securing member 10. The diameter of the securing hole 513 is substantially equal to the outer diameter of the annular base 11, and a distance between outmost ends of the hooks 12 of the securing member 10 is greater than an inner diameter of the securing hole 513, for allowing the hooks 12 to extend through the securing hole 513 and the claws 123 to engage with the securing portions 51 under the supporting surface 511 of the motherboard 50.

In assembly, the damping members 20 are arranged to engage with the through holes 31. A bounding surface of each through hole 31 of the motherboard 30 is accommodated in the receiving slot 26 of the corresponding damping member 20. The upper flange 211 and the lower flange 213 of the damping member 20 respectively abut the top surface and the bottom surface of the motherboard 30. Then, the motherboard 30 with the damping members 20 are put on the chassis 50. The lower flange 213 of each damping member 20 abuts on the supporting surface 511 of the corresponding securing portion 51 of the chassis 50, for absorbing the vibration generated between the motherboard 30 and the chassis 50. In assembly of the securing members 10 for mounting the motherboard 30 to the chassis 50, the hooks 12 are aligned with the corresponding slots 25 of each damping member 20 and are extended through the damping member 20 and the through hole 31 of the motherboard 30. The claws 123 of the hooks 12 are squeezed inward and the hooks 12 are resiliently deformed by the inner periphery of the securing hole 513 of the chassis 50 so that the claws 123 are capable of extending through the securing hole 513. Once the claws 123 have completely extended through the securing hole 513, the blocking portions 17 abut on the upper flange 211 of the damping member 20, and the hooks 12 return back to their initial state and the claws 123 engage with a bottom side of the supporting surface 511 of the chassis 50 to retain the motherboard 30 on the chassis 50. In other embodiments, the securing member 10 may be assembled from a reversed direction. Thus, the receiving slot 26 of the damping member 20 can be arranged to be received inside the securing hole 513 of the chassis 50.

In disassembly, the handle 15 of the securing member 10 is moved upward, the actuating portion 13 is forced to move up so that the oblique connecting arms 14 connected with distal ends of the claws 123 of the hooks 12 pull the hooks 12 to move inward with the connecting arms 14. When the claws 123 of the hooks 12 move to a position disengaging from the bottom side of the supporting surface 511 of the chassis 50, the securing member 10 is ready for being removed.

Referring to FIGS. 6-9, the securing member 10 can also be used for mounting various electronic devices, such as a cooling fan 60 to a chassis 50'. The securing member 10 may also be made of material having good resiliency such as plastic or elastomer, for absorbing vibration between the fan 60 and the chassis 50' when the securing member 10 is directly disposed between the fan 60 and the chassis 50'. The cooling fan 60 includes an upper frame 61 and a bottom frame 63. Four securing slots 631 corresponding to the four hooks 12 of the securing member 10 are defined in a center of the bottom frame 63 and are arranged in a round. The outmost side of each securing slot 631 is biased against the side of the corresponding claw 123 when the securing member 10 is assembled with the fan 60 and the chassis 50', and is more closer to the center of the bottom frame 63 than the claw 123. Four positioning holes 633 are defined in four corners of the bottom frame 63. The chassis 50' defines a securing hole 51' corresponding to the securing member 10, for allowing the securing member 10 extending therethrough to engage with the securing slots 631 in the cooling fan 60. Four positioning posts 53' protrudes from the chassis 50' corresponding to the positioning holes 633 in the bottom frame 63. In assembly, the positioning holes 633 are aligned with the positioning posts 53'. The fan 60 is pushed down, the positioning posts 53' are inserted in the positioning holes 633 to limit the movement between the fan 60 and the chassis 50' in directions parallel to the chassis 50'. Then, the securing member 10 is pushed to extend through the securing hole 51' of the chassis 50', and the claws 123 of the hooks 12 are squeezed inward and the hooks 12 are resiliently deformed by surrounding portions of the securing slots 631 of the fan 60 so that the claws 123 are capable of extending through the securing slots 631. Once the claws 123 have completely extended through the securing slots 631, the blocking portions 17 abut against the bottom side of the chassis 50', and the hooks 12 return back to their initial state and the claws 123 engage with the bottom frame 63 of the fan 60 to retain the fan 60 on the chassis 50'.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A mounting mechanism for mounting an electronic device to a chassis, the electronic device defining a first securing hole, and the chassis defining a second securing hole, comprising:

a securing member comprising a base, a plurality of elastic hooks extending from a bottom of the base, at least one blocking portion protruding laterally from the base, the elastic hooks being configured for extending through the first securing hole and the second securing hole and engaging with a bottom side of one of the chassis and the electronic device, and the at least one blocking portion abutting on the other one of the chassis and the electronic device, for sandwiching the electronic device and the chassis between the hooks and the at least one blocking portion, and an actuating member connected to the elastic hooks; wherein the actuating member is capable of being pulled away from the chassis and the electronic device so as to disengage the elastic hooks from the bottom side of one of the chassis and the electronic device.

2. The mounting mechanism as described in claim 1, wherein the base of the securing member defines an empty center, the actuating member is disposed in the center of the base, and a plurality of connecting bars extends from one side of the actuating member and obliquely depends from top ends of the hooks for facilitating engagement between the hooks and the actuating member.

3. The mounting mechanism as described in claim 2, wherein a handle protrudes from the actuating member in the other side thereof opposite to the connecting arms.

4. The mounting mechanism as described in claim 1, further comprising a damping member having an upper flange and a lower flange, one of the upper and lower flanges of the damping member is disposed between the electronic device and the chassis, and the other is abutted against by the blocking portion of the securing member.

5. The mounting mechanism as described in claim 4, wherein the damping member comprises a ring shaped body, a receiving slot is defined in an outer periphery of the body to divide the vibration member into the upper flange and the lower flange.

6. The mounting mechanism as described in claim 4, wherein the damping member defines a through hole in the center thereof corresponding to the first and second securing holes, for the hooks of the securing member extending therethrough to engage with one of the chassis and the electronic device.

7. The mounting mechanism as described in claim 6, wherein each hook comprises an elastic cantilever flush with a peripheral surface the base of the securing member and a claw protruding laterally from a distal end of the cantilever, and the damping member defines a slot corresponding to the claw in the inner surface thereof in communication with the through hole, for allowing the hook to extend through the damping member freely.

8. A mounting mechanism for mounting an electronic device to a chassis, comprising:

a securing member comprising a base, the base defining an empty center, a plurality of hooks extending from a bottom of the base, at least one blocking portion protruding laterally from the base, the hooks being elastically engaged with one of the electronic device and the chassis, and the at least one blocking portion pressingly acting on the other, thereby sandwiching the electronic device and the chassis between the at least one blocking portion and the hooks, an actuating member formed in the empty center of the base with a plurality of connecting arms extending therefrom obliquely depending from distal ends of the hooks respectively for driving the hooks to disengage from one of the electronic device and the chassis.

9. The mounting mechanism as described in claim 8, wherein a handle protrudes from the actuating member in the other side thereof opposite to the connecting arms.

10. The mounting mechanism as described in claim 8, further comprises a damping member having an upper flange and a lower flange, one of the upper and lower flanges of the damping member is disposed between the electronic device and the chassis, and the other is abutted against by the blocking portion of the securing member.

11. The mounting mechanism as described in claim 10, wherein the damping member comprises a ring shaped body, a receiving slot is defined in an outside surface of the body to divide the vibration member into the upper flange and the lower flange.

12. The mounting mechanism as described in claim 10, wherein the damping member defines a through hole in the center thereof corresponding to the first and second securing holes, for the hooks of the securing member extending therethrough to engage with one of the chassis and the electronic device.

13. The mounting mechanism as described in claim 12, wherein each hook comprises an elastic cantilever flush with a peripheral surface of the base of the securing member and a claw protruding laterally from a top end of the cantilever, and the damping member defines a slot corresponding to the claw in the inner periphery thereof in communication with the through hole, for allowing the hook to extend through the damping member freely.

\* \* \* \* \*